United States Patent [19]

Yoshida et al.

[11] 4,071,785

[45] Jan. 31, 1978

[54] LAMINATED PIEZOELECTRIC MATRIX SWITCH

[75] Inventors: Masafumi Yoshida; Hiroshi Obara, both of Iwaki, Japan

[73] Assignee: Kureha Kagaku Kogyo Kabushiki Kaisha, Tokyo, Japan

[21] Appl. No.: 681,934

[22] Filed: Apr. 30, 1976

[30] Foreign Application Priority Data

May 2, 1975  Japan .................................. 50-53727

[51] Int. Cl.² ............................................ H01L 41/04
[52] U.S. Cl. .................................................. 310/331
[58] Field of Search ................. 310/8.3, 8.7, 8.5, 8.6, 310/9.1, 9.4

[56] References Cited

U.S. PATENT DOCUMENTS

| 3,648,279 | 3/1972 | Watson | 310/8.3 X |
| 3,940,637 | 2/1976 | Ohigashi et al. | 310/8.5 X |

*Primary Examiner*—Mark O. Budd
*Attorney, Agent, or Firm*—Sughrue, Rothwell, Mion, Zinn and Macpeak

[57] ABSTRACT

A matrix switch comprises a lamination of several layers in which first and second piezoelectric films have row and column electrodes, respectively, arranged in parallel on their first surfaces. A ground electrode is between said row and column electrodes. The operating electrodes are at cross points which are deformable to result in two piezoelectric output signals from each cross point; one between ground and an operating row electrode, and the other between ground and an operating column electrode.

1 Claim, 10 Drawing Figures

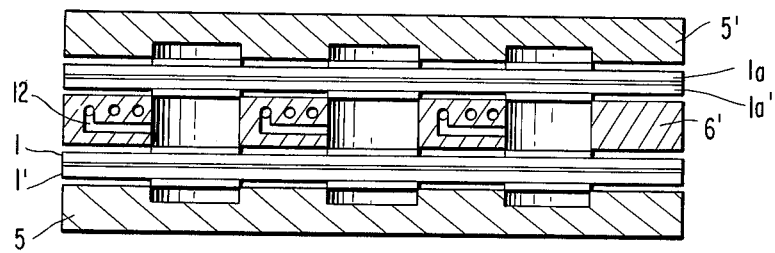
FIG.4
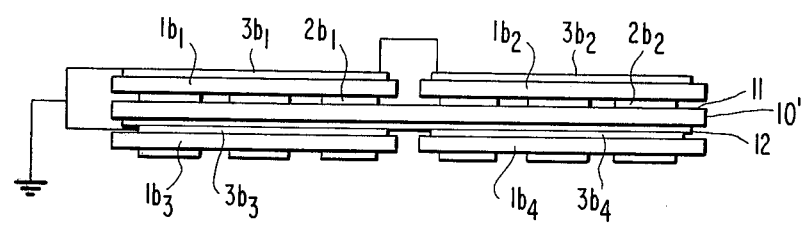
FIG.5
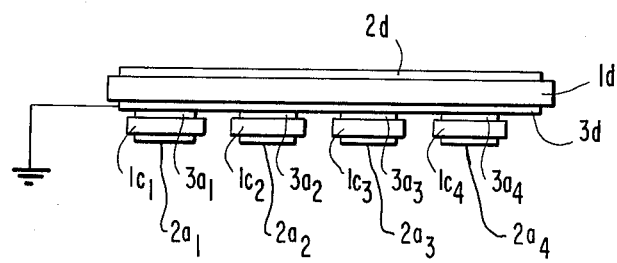
FIG.6
FIG.7
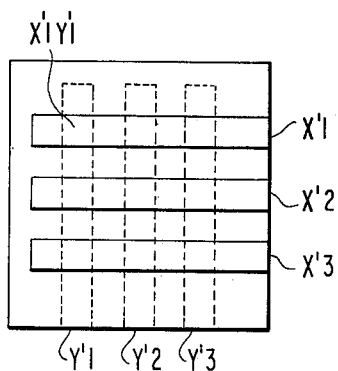
FIG.8
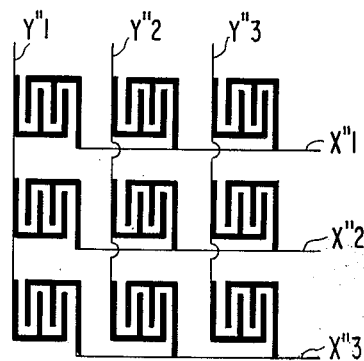

LAMINATED PIEZOELECTRIC MATRIX SWITCH

BACKGROUND OF THE INVENTION

The invention relates to a matrix switch having a piezoelectric material for converting key depressions or the like into electrical signals.

It is well known in the art that a thermoplastic film such as, for example, a pressed poly-y-methyl glutamate film, and a polarized polyvinyl fluoride or polyvinyliden fluoride film has a piezoelectric property. Keyboard switches in which these piezoelectric plastic films are used, have also been proposed, for example, in Japanese Opened Patent Application No. 47-37244 and in Japanese Patent Application No. 48-118801.

Since a piezoelectric thermoplastic film of a desired area is easily obtainable and has a relatively low Young's modulus and hence high elasticity, a keyboard switch having any desired number of stress action points can be produced easily and is applicable for use as a coded signal input device.

When a coded signal is read out from the keyboard by pushing one of the keys arranged on the keyboard, at least two kinds of signals, i.e. a row signal and a column signal, are obtained in accordance with the selected key, and the position of the key can be identified by the combination of the obtained signals. Such keyboard switch basically comprises a substrate and a piezoelectric film disposed on the substrate, wherein two groups of parallel conductors are placed on the upper and lower surfaces, respectively, so as to provide cross points at which the respective keys are positioned, e.g. as shown in FIG. 7. In such keyboard, the conductors to as $X'1, X'2, X'3 \ldots X'm$ are arranged in rows and the conductors $Y'1, Y'2, Y'3 \ldots Y'n$, are arranged in columns. The cross points, for example, $(X'1, Y'1)$ can be identified as the crossing point of the conductors $X'1$ and $Y'1$. When a field effect transister (FET) is to be driven by a piezoelectric field produced at, for example, $X'1$, it is usual to connect the conductor $X'1$ to a gate of the FET and to ground a corresponding electrode $Y'1$ on the backside surface of the film. Since the electrode $Y'1$ is used to drive another FET, and thus should not be grounded directly, a very complicated circuit means is required as the indentification circuit for the position $(X'1, Y'1)$.

An alternative structure of a keyboard switch comprises a common ground electrode on the under surface of the piezoelectric film, and at least two simultaneously operating separated electrodes in the respective key positions. In the case where two electrodes are provided as shown in FIG. 8, it is usual that the electrodes arranged in each of rows $X''1, X''2 \ldots X''m$ are connected with one another, and that the electrodes arranged in each of columns $Y''1, Y''2 \ldots Y''n$ are also connected with one another. The row and column electrodes are respectively connected to the ground electrode. In this arrangement, the keys on a row or a column can be read out by means of a reading circuit. Therefore, only $n + m$ reading circuits are required for a $n \times m$ matrix. This substantially reduces the number of the switch circuits required. On the other hand, the row electrodes and the column electrodes placed will intersect in a matrix of more than $2 \times 2$, and therefore cannot be placed on a common plane. In order to prevent contact between the row and column electrodes, it is necessary to connect each electrode of either the row electrodes or column electrodes to contacts on the under surface of a printed circuit board so as to place the row electrodes and the column electrodes on separated planes. Further, in the case where the row electrodes and the column electrodes are placed on a common plane and where two electrodes are placed in one key position, comb shaped electrodes may be used as shown in FIG. 8. The comb shaped electrodes can prevent the piezoelectric fields of different magnitudes from being generated in two key positions when the key is pushed with a slight shift.

A keyboard switch using a piezoelectric film is advantageous in that it can be manufactured simply by laminating the film provided with a plurality of key operating points on a base plate. However it is disadvantageous in that each of either the row or column electrodes in required to be connected to each operating point of a printed circuit board and in that electrodes having a complex structure, such as comb shaped electrodes, are required.

SUMMARY OF THE INVENTION

In accordance with this invention, there is provided a switch comprising first piezoelectric film having one side operating electrodes arranged in rows and on the other side a ground electrode, and a second piezoelectric film having on one side operating electrodes arranged in columns and on the other side a ground electrode. The two piezoelectric films are laminated with their respective ground electrodes facing each other so that the ground electrodes can be commonly grounded. Since the row electrodes and the column electrodes are placed on the outer surfaces of the laminated film element and insulated from each other, it is possible to provide key switch identification circuits between the row electrodes and the ground electrode and between the column electrodes and the ground electrode. With this arrangement, the signal on each row of the electrodes or on each column of the electrodes can be identified separately, resulting in a reduction of the number of the identification circuits required. Further, the row electrodes and the column electrodes are placed on separated planes to be held electrically independent even when they cross in a desired manner. This eliminates the need for each electrode to be connected to each contact of the printed circuit board and permits the use of electrodes which have a simple structure.

BRIEF DESCRIPTION OF THE DRAWING

FIG. 4 is a cross-sectional view of another embodiment of the present invention.

FIG. 5 is a cross-sectional view of a further embodiment of the present invention.

FIG. 6 is a cross section of a still further embodiment of the present invention.

FIG. 7 is a plan view of an example of the conventional matrix switch as previously described.

FIG. 8 is a plan view of another example of the conventional matrix switches as previously described.

DETAILED DESCRIPTION OF THE PREFERRED EMBODIMENTS

Figure 1A:
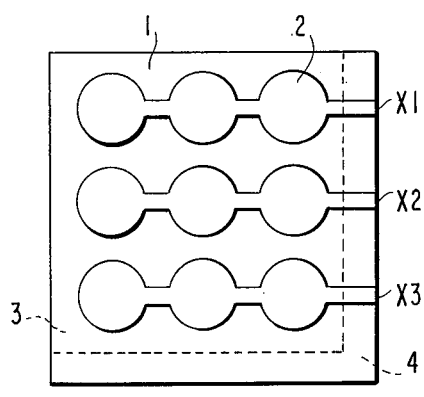
FIGS. 1a and 1b are upper and a lower plan views of a pair of piezoelectric plastic films which are constituents of a matrix switch embodying the present invention.
Figure 1B:
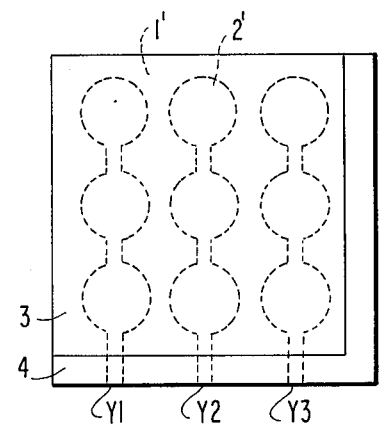
Figure 2A:
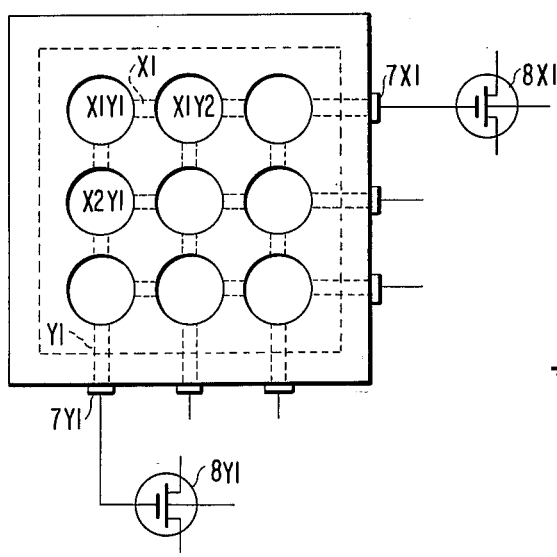
FIG. 2a is a plan view of the matrix switch of the present invention.
Figure 2B:
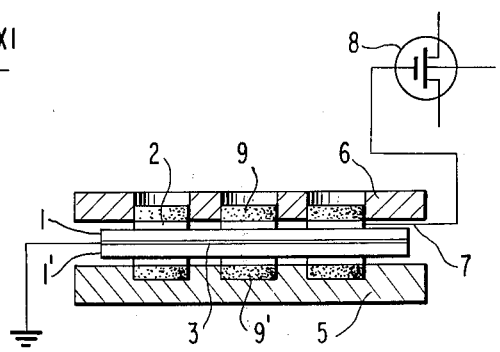
FIG. 2b is a cross section of the matrix switch in FIG. 2b.

In FIGS. 1a and 1b, the reference numeral 1 indicates a first piezoelectric high molecular film having electrodes 2 arranged in rows X1, X2, X3 ... Xn, and the reference numeral 1' indicates a second piezoelectric high molecular film having electrodes 2' arranged in columns Y1, Y2, Y3 ... Yn. Each of the piezoelectric films 1 and 1' has its under surface (the film 1' is seen from its under surface in FIG. 1(b)) provided with a ground electrode 3, 3' except for its insulated portion 4, 4'. As shown in FIG. 2b the films 1 and 1' are laminated with their ground electrodes facing each other, and the laminated structure is held between two base plates, 5 and 6, each having windows in the positions according to the key (one of the base plates may have recesses instead of windows) to form a switch base. Each row of the row electrodes and each column of the column electrodes is coupled to a respective reading circuit. The reference numeral 5 is a base plate having recesses in switch positions, and the reference numeral 6 is another base plate having windows in registry with the recesses. When a stress is applied to a key position, for example, a point (X1, Y1) in FIG. 2a, the piezoelectric fields generated in the films 1 and 1' are conducted through the electrodes X1 and Y1 to the terminals 7X1 and 7Y1 so as to actuate FETs 8X1 and 8Y1, respectively. The key position is read out by the combination of the signals applied to the FETs 8X1 and 8Y1. The reference numerals 9 and 9' indicate buffer members made of foamed polyurethane or the like. If desired, push buttons (not shown) may be provided on the rubber member 9, and a plate (not shown) having windows for receiving the push buttons may be provided over the plate 6. For a matrix in a condition $n = m = 10$, 20 FETs are used to identify 100 key positions.

Figure 3:
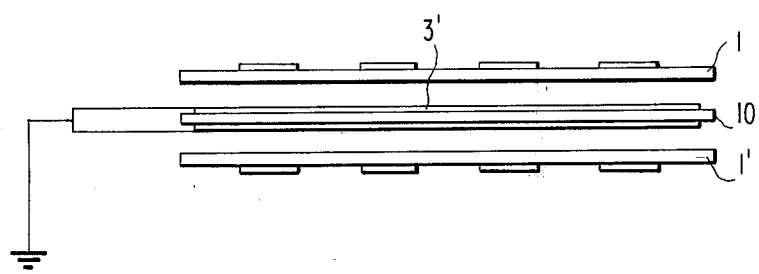
FIG. 3 is a cross-sectional view of an example of the laminated film to be used in the present invention.

The films 1 and 1' may be coupled in lamination by the use of adhesive, which is not necessarily required, or may be laminated only be laying one on top of the other. The ground electrode is not required to cover all of the area of the film and may be positioned to cover at least that portion of the film corresponding to each of the key positions. Only one of the films 1 and 1' need have a ground electrode, which is used as a common ground electrode after the films 1 and 1' are laminated. Further, a metal leaf foil, metal deposition or conduction point can be held between the two piezoelectric films to provide a ground electrode. FIG. 3 shows a laminated film element of this type in which two piezoelectric films 1 and 1' having row or column electrodes hold therebetween a non-piezoelectric film 10 having metal films 3' on its both surfaces and having its metal films grounded (FIG. 3 shows the films before lamination).

The piezoelectric high molecular films for use in this invention are not required to be piezoelectric throughout their entire areas, but must have piezoelectric property at least in the positions of the operating electrodes. That is, a film having electrodes attached to its operating electrode positions and at least their back surfaces as shown in FIG. 1a can be made piezoelectric only in the portions provided with the electrodes by the use of a d.c. field applied between the attached electrodes to polarize them while heating the film to a polarization temperature. Further, the film can be made piezoelectric substantially over the entire area by covering both surfaces thereof with electrodes to polarize the film and then attaching electrodes to the required portions as shown in FIGS. 1a and 1b after removing the first electrodes partially or completely.

A piezoelectric high molecular film produces an electric field between its surfaces when a stress is applied to the film to stretch it or removed from the film to shorten it. Two laminated piezoelectric high molecular films may have the same or different polarities for their respective piezoelectric fields. That is, it is not required that the potentials at the row and column electrodes be of the same polarity.

The matrix switch according to the present invention is not always limited to the use of a lamination of two peizoelectric film layers, but a lamination structure composed of any number of the layers larger than two may be used. In such case, however, it is necessry to insulate between the operating electrodes contacting with the respective piezoelectric films and between the operating electrodes of one of the films and the ground electrode or electrodes of other films. In the case of the two layer structure, a desirable lamination is easily obtained by facing the ground electrodes of the films as mentioned previously. However, in the case of three or more layers, an insulating layer should be placed between the operating electrodes of these films or between the operating electrodes and the ground electrodes because it is impossible to face the ground electrodes. The insulating layer may be of insulative adhesive, insulative polymer film or porous plate. For example, in FIG. 4, which shows a matrix comprised of a multi-layered element, a composite film element composed of a lamination of a pair of laminated piezoelectric plastic films 1 and 1', another pair of laminated piezoelectric plastic films 1a and 1a' and a porous plate 6' having windows at the key positions and interposed between the plastic film laminations is provided. A pair of substrates 5 and 5' are further stacked on both surfaces of the composite lamination; each of the substrates 5 and 5' being provided with recesses in its surface facing the composite lamination and at the key positions. A numeral 12 shows gas passages connected to different ones of the key positions. When pressurized air is supplied to one of the gas passages, a piezoelectric field is produced in the corresponding portions of the four films, and accordingly, signals are derived from terminals connected to the conductors on the four films. Therefore, assuming the numbers of the conductors on the four films are $m_1$, $m_2$, $m_3$ and $m_4$, respectively, the number of the key wirings becomes $m_1 + m_2 + m_3 + m_4$. However, the number of keys identifiable in the two dimensional matrix composed of two pairs of the piezoelectric films becomes $m_1 \times m_2 + m_1 \times m_3 + m_1 \times m_4 + m_2 \times m_3 + m_2 \times m_4 + m_3 \times m_4$. When a three dimensional matrix composed of two groups of piezoelectric films, each group including three films, the number of identifiable keys becomes $m_1 \times m_2 \times m_3 + m_1 \times m_2 \times m_4 + m_2 \times m_3 \times m_4$ and for a four dimentional matrix composed of two groups each having four films, the number becomes $m_1 \times m_2 \times m_3 \times m_4$.

When it is assumed in FIG. 4 that a single film is used in one side of the porous plate by removing, for example, the film 1a' and $n_1$, $n_2$ and $n_3$ conductors are provided on the respective three films, the numbers of keys indentifiable by the two dimentional matrix are $n_1 \times n_2 + n_1 \times n_3 \times n_2 \times n_3$ and $n_1 \times n_2 \times n_3$, respectively.

The matrix switch operable in this manner on fluid pressure is adaptable for use in, for example, relay circuits to be controlled by instruments. Further the multidimensional matrix switch as in FIG. 4 can be easily applied, not only to a fluid operated switch, but also to a push button operated keyboard switch.

Although the embodiments have been described as composed of laminated piezoelectric films attached onto a porous plate, the laminated films may be attached onto an elastic plate such as a plate of rubber. In the latter case, however, the interelectrode distances should be determined, according to material and thickness etc. of the elastic plate, so that a stress exerted on an operating electrode does not cause adjacent operating electrodes to be deformed and produce noise signals.

Further, it is not always necessary to form the piezoelectric film layer with a single continuous piezoelectric film. The layer may be formed by using a plurality of film pieces. For example, in FIG. 5, on one surface 11 of an insulative high molecular film 10' opposite the surface 12 which is metallized, two piezoelectric plastic films $1b_1$ and $1b_2$ are disposed with the operating electrodes $2b_1$ and $2b_2$ of the films $1b_1$ and $1b_2$ being inside. On the surface 12 of the film 10', a corresponding pair of piezoelectric plastic films $1b_3$ and $1b_4$ are attached with the ground electrodes $3b_3$ and $3b_4$ thereof in contact with the metallized surface 12. Further, the ground electrodes $3b_1$, $3b_2$, $3b_3$ and $3b_4$ of the respective four piezoelectric films $1b_1$, $1b_2$, $1b_3$ and $1b_4$ are grounded commonly. This construction is convenient in a case where a wide piezoelectric film is difficult to obtain. A switch can be obtained by using a plurality of piezoelectric film strips each having a desired width.

FIG. 6 shows another embodiment in which a plurality of piezoelectric film pieces $1c_1$, $1c_2$... each having a ground electrode and an operating electrode are adhered to a broad piezoelectric film layer $1d$ with a ground electrode $3d$ and an operating electrode $2d$ so that the electrodes $3a_1$, $3a_2$... on the piezoelectric film pieces may be in contact with the ground electrode $3d$ and the operating electrodes $2a_1$, $2a_2$... be arranged in orthogonal direction to the operating electrodes ($2d$).

What is claimed is:

1. A matrix switch comprising, a first lamination of at least two piezoelectric plastic film layers, each being provided with a plurality of operating electrodes on respective first surfaces thereof and with a ground electrode on respective second surfaces thereof, said ground electrode covering at least areas corresponding to those of said operating electrodes on each of said first surfaces, said operating electrodes on one of said film layers being arranged in parallel rows, said operating electrodes in each row being electrically connected to one another, said operating electrodes on the other of said film layers being arranged in parallel columns, said operating electrodes in each column being electrically connected to one another, said film layers being positioned in said lamination such that said operating electrodes of said one film layer are positioned correspondingly to said operating electrodes of said the other film layer respectively so that each of said rows crosses said columns at positions of said operating electrodes, and said crossing points are used as key operating points, said ground electrodes comprise physically distinct ground electrodes, one for each said film layer, facing and in direct contact with each other, a second lamination of at least two piezoelectric plastic film layers identical with said first lamination, said first and second laminations being positioned so that the operating electrodes of each are in registry with one another, and a porous plate separating said first and second laminations, wherein said porous plate has windows in registry with the operating electrodes of said first and second laminations and gas passages communicating with said windows, further comprising a pair of substrates stacked on opposite surfaces of the composite lamination including said first and second laminations and said porous plate, said substrates each having recesses in the surface facing the composite lamination, said recesses being in registry with the operating electrodes of said first and second laminations.

* * * * *